United States Patent
Wilson

(10) Patent No.: US 10,330,813 B2
(45) Date of Patent: Jun. 25, 2019

(54) OCCUPANT DETECTION SYSTEM

(71) Applicant: TK Holdings Inc., Auburn Hills, MI (US)

(72) Inventor: David Wilson, Pontiac, MI (US)

(73) Assignee: JOYSON SAFETY SYSTEMS ACQUISITION LLC, Auburn Hills, MI (US)

(*) Notice: Subject to any disclaimer, the term of this patent is extended or adjusted under 35 U.S.C. 154(b) by 9 days.

(21) Appl. No.: 15/646,841

(22) Filed: Jul. 11, 2017

(65) Prior Publication Data

US 2019/0018163 A1 Jan. 17, 2019

(51) Int. Cl.
*G01V 3/08* (2006.01)
*G01D 5/241* (2006.01)
*G01R 27/26* (2006.01)

(52) U.S. Cl.
CPC ........... *G01V 3/088* (2013.01); *G01D 5/2417* (2013.01); *G01R 27/2605* (2013.01)

(58) Field of Classification Search
None
See application file for complete search history.

(56) References Cited

U.S. PATENT DOCUMENTS

| | | |
|---|---|---|
| 4,370,697 A | 1/1983 | Haberl et al. |
| 6,640,175 B2 | 10/2003 | Vos et al. |
| 6,808,201 B2 | 10/2004 | Aoki |
| 7,176,390 B2 | 2/2007 | Hansen et al. |
| 7,217,891 B2 | 5/2007 | Fischer et al. |
| 7,500,536 B2 | 3/2009 | Bulgajewski et al. |
| 7,639,125 B2 | 12/2009 | Federspiel et al. |
| 7,891,260 B2 | 2/2011 | Hansen et al. |
| 8,896,326 B2 | 11/2014 | Stanley et al. |
| 9,120,396 B2 | 9/2015 | Tabaczynski et al. |
| 9,278,629 B2 | 3/2016 | Stanley et al. |
| 9,428,080 B2 | 8/2016 | Kordel et al. |
| 9,487,106 B2 | 11/2016 | Moon et al. |
| 2004/0099999 A1* | 5/2004 | Borland .................. H01G 4/01 264/618 |
| 2006/0196281 A1 | 9/2006 | Koors |

(Continued)

FOREIGN PATENT DOCUMENTS

| | | |
|---|---|---|
| EP | 0 855 307 B1 | 3/2003 |
| EP | 1 342 627 B1 | 4/2008 |

(Continued)

*Primary Examiner* — Clayton E. LaBalle
*Assistant Examiner* — Jas A Sanghera
(74) *Attorney, Agent, or Firm* — Gordon Rees Scully Mansukhani, LLP

(57) ABSTRACT

A capacitive detection system including an upper electrode printed on an upper film layer and a lower electrode printed on a lower film layer. The system includes a plurality of nodes of dielectric material printed in a spaced apart pattern on the lower film layer. The upper film layer is positioned over the lower film layer so that when a downward force is applied to the upper film layer the distance between at least a portion of the upper conductor and the lower conductor decreases. The system includes a controller operatively connected to the upper and lower electrodes. The controller includes a sensing circuit or processor configured to detect the presence of the occupant using a measure of the capacitance between the upper and lower electrode.

15 Claims, 4 Drawing Sheets

(56) References Cited

U.S. PATENT DOCUMENTS

| | | | |
|---|---|---|---|
| 2007/0261894 A1 | 11/2007 | Harish | |
| 2008/0018611 A1* | 1/2008 | Serban | G06F 3/0416 |
| | | | 345/173 |
| 2010/0192698 A1 | 8/2010 | Hansen et al. | |
| 2011/0023631 A1 | 2/2011 | Sleeman | |
| 2013/0047747 A1* | 2/2013 | Joung, II | G01L 1/142 |
| | | | 73/862.68 |
| 2018/0225990 A1* | 8/2018 | Jiang | H03K 17/962 |

FOREIGN PATENT DOCUMENTS

| | | |
|---|---|---|
| EP | 1 769 975 B1 | 6/2008 |
| EP | 1 968 360 A1 | 9/2008 |
| EP | 1 731 378 B1 | 4/2010 |
| EP | 2 216 200 A1 | 8/2010 |
| EP | 2 662 250 B1 | 8/2015 |
| GB | 2 325 746 B | 11/2000 |

* cited by examiner

OCCUPANT DETECTION SYSTEM

BACKGROUND

The present application relates to a system for detecting the presence of an occupant of a seat. More particularly, the application relates to a capacitive sensing system for detecting the presence of a person. In a disclosed embodiment, the system is used for detecting the presence of an occupant in a vehicle seat.

BRIEF DESCRIPTION OF THE DRAWINGS

The features, aspects, and advantages of the present invention will become apparent from the following description, and the accompanying exemplary embodiments shown in the drawings, which are briefly described below.

DETAILED DESCRIPTION

According to a disclosed exemplary embodiment the system is directed to a seat occupancy detection system that is configured to detect the presence of an occupant in a seat. According to other exemplary embodiments, a sensing system may use multiple electrodes on opposite sides of a spacer layer. Measurements may be made while the electrodes are in various configurations within a sensing circuit. According to still other exemplary embodiments, a sensing system may combine or integrate weight sensing concepts with capacitive sensing concepts into a single system. The integrated system may use weight/pressure information along with capacitive information to identify the occupant situation and produce a preferred classification.

According to various exemplary embodiments, a sensing system may use electronic methods for making capacitive measurements. The sensor assembly materials may include any type of conductive material for the electrodes (e.g., copper, conductive inks, conductive fabrics, etc.) and any compressible dielectric material for the spacer between the sensor and the shield.

According to a disclosed embodiment, the capacitive sensing or detection system may include a sensing mat or pad located in a vehicle seat. The pad may include a first layer including a first conductor and a second layer including a second conductor. The layers are separated by a compressible spacer. The system may also include a sensing circuit operatively coupled to the first and second conductors and configured to sense the presence of an object using a measure of the capacitance between the first and second conductors. The compressible spacer preferably includes a plurality of nodes of dielectric material.

Figure 1:
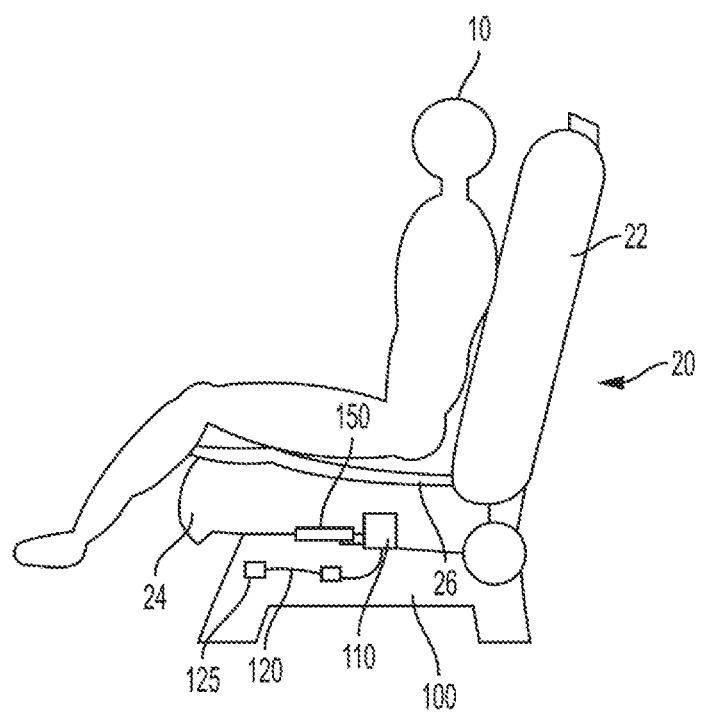
FIG. 1 is a side view of a vehicle seat containing an occupant detection system.

As shown in FIG. 1, an occupant detection system 100 may be located in a vehicle seat 20. The seat may include a seat back 22 and a seat bottom 24. The detection system 100 is preferably located in the seat bottom 24 below a seat cover 26. The detection system 100 includes a sensor pad or mat 150, a controller 110 and a wire harness 120. The harness 120 carries power and connectivity to the vehicles power system and communication bus. The harness 120 is connected to the vehicle's electrical system(s) by a connector 125.

Figure 2:
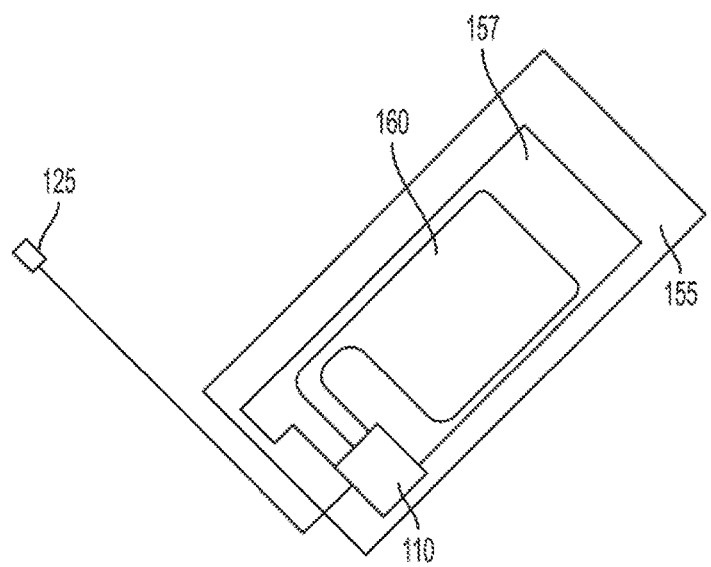
FIG. 2 is a top view of the occupant detection system of FIG. 1.
Figure 3:
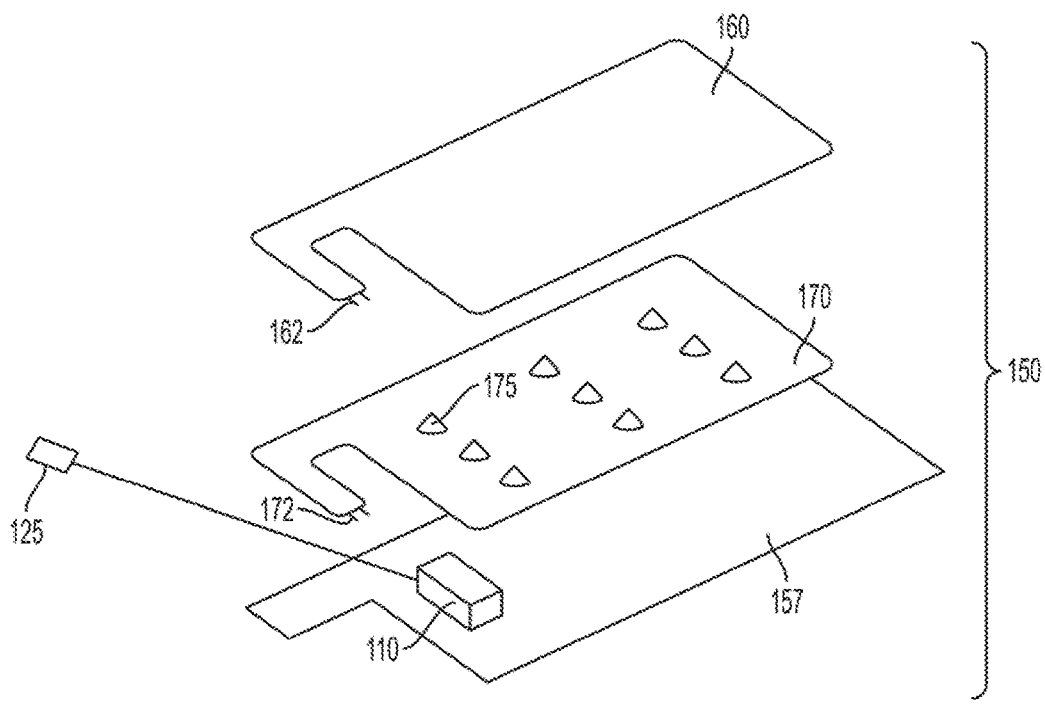
FIG. 3 is an exploded view of a sensor pad used in the occupant detection system of FIG. 2.

FIG. 2 is a top view of various components of the sensing system 100. The system includes an optional supporting lower substrate 155. The lower substrate 155 may comprise a felt material and may be connected or mounted to a structural component of the vehicle seat such as, for example, the seat pan. An upper substrate layer 157, preferably felt material, is positioned below spaced conductor layers and provides support for the controller 110.

The system 100 includes spaced conductor layers 160 and 170. The capacitance between the conductor layers may be monitored to determine a measure of the force on the seat 20, which may be associated with a person seated on the seat 20. Each of the conductor layers is connected to the controller 110 by an electronic connector 162, 172. The connectors 162, 172 carry an electronic signal to each of the conductor layers. The electronic signals provided to the conductor layers may be a time varying voltage signal such as, for example, a sinusoidal signal. Each of the conductor layers is preferably a single sheet of plastic type film material. For example, Polyethylene Terephthalate (PET) film may be used for either or both of the conductor layers. Alternatively, other poly based films such as PEN, PC, PI or PEI may be used for the conductor layer. Each of the conductor layers preferably includes a printed conductive material that forms the conductor, conductive trace or "wire" carrying the electronic signal through the conductor layer. Preferably, the conductor is an ink based material that may be printed onto the film. The conductive ink may include, for example, Silver (Ag), Silver/Silver Chloride (Ag/AgCl), and/or Carbon. The conductive ink is preferably printed in a pattern on the film base layer.

The upper and lower base or conductor layers 160, 170 are spaced apart or separated by a spacer layer. The spacer layer includes dielectric material. Preferably, the dielectric material is an ink based material that may be printed on the lower base layer 170 in a pattern of nodes, dots or mounds 175. The shape of the node may vary. For example, the node may be tapered with a base that has a larger area than the top portion. For example, a cylinder, cube, cone, prism, pyramid or other suitable shape may be used. Each of the nodes 175 includes a top portion that contacts the upper base layer 160. As force is applied to the vehicle seat 20 (e.g., the seat bottom 24), due to the space between the nodes 175, the distance between at least a portion of the upper conductor layer 160 and the lower conductor layer 170 is allowed to decrease.

The controller 110 includes a sensing circuit and/or processor that determines a measure of the capacitance between the upper and lower conductor layers 160, 170. A change in the measure of capacitance may be used by the system 100 to indicate the presence of an occupant 10 in the vehicle seat 20. The controller 110 may provide data to the vehicle communication bus via the conductive wires contained in the wire harness 120, which is connected to the vehicle power and communication systems via a connector 125.

Figure 4:
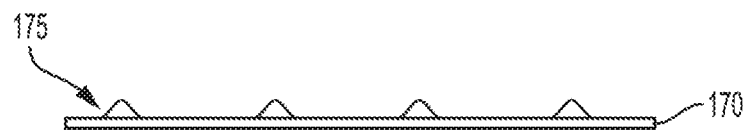
FIG. 4 is a side view of a lower base layer used in the sensor pad of FIG. 3.
Figure 5:
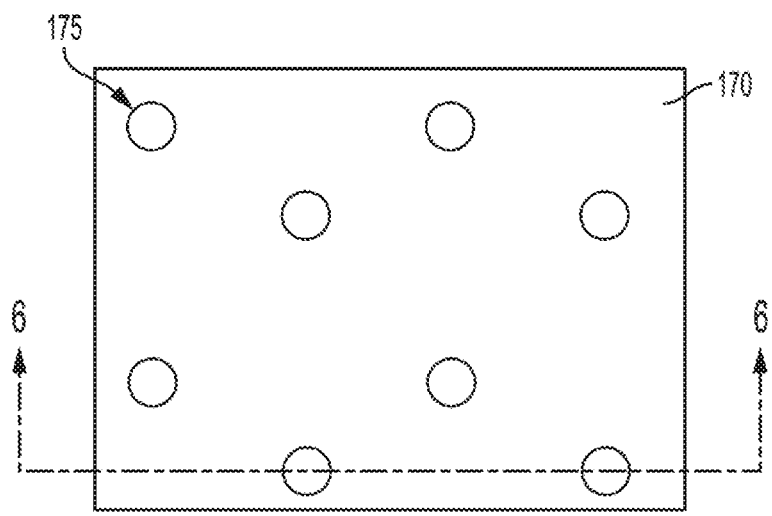
FIG. 5 is top view of the lower base layer of FIG. 4.
Figure 6:
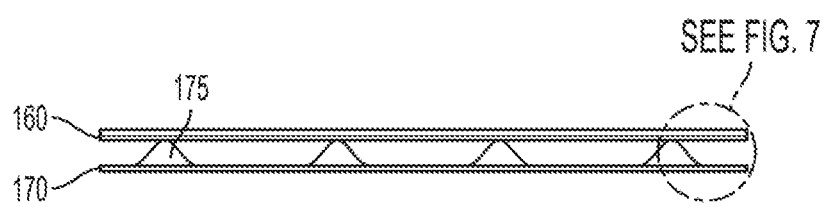
FIG. 6 is a partial cross-sectional view of the sensor pad of FIG. 5 sectioned through lines A-A and including the upper and lower base layers.

As shown in FIGS. 4 and 5, the dielectric material is arranged on top of the lower film layer 170 in a spaced apart pattern that creates a gap between the film layers. The pattern of the nodes 175 could be any suitable shape, size and spacing due to the capabilities of the screening process. The pattern of the nodes could be easily adjusted to be suitable for different seat configurations. For example, the nodes could cover less than 20 percent of the surface area of the film base layer in order to allow for a sufficiently sized volume of the gap between the upper and lower electrodes. Decreasing the percentage of the surface area covered by the nodes could make the occupant detection system more sensitive.

The cost and time for development of a suitable capacitive sensing system is greatly reduced due to the ease of construction and adjustment of the node position. The position of the nodes allow the gap or space between the nodes to be adjusted to provide for appropriate detection of the occupant. For the purposes of analyzing the operation of the system, the nodes of dielectric material can be considered to be incompressible such that there is no requirement to analyze a spring constant for the spacer layer. The spacer layer is essentially the gap between the nodes of dielectric material. The ability to precisely locate the nodes of dielectric material allow the system to provide for more precise measurement and calibration of the system and will provide for accurate detection of occupants on the seat. The thickness of the entire sensing mat can potentially be reduced to 0.350 microns or less in order to make the overall system less intrusive in the seat structure. The thickness of the spacer layer could be reduced to 5-8 microns, for example. As mentioned above, the system may be modified to accommodate different seat designs including different seat pan and/or seat spring configurations.

Figure 7:
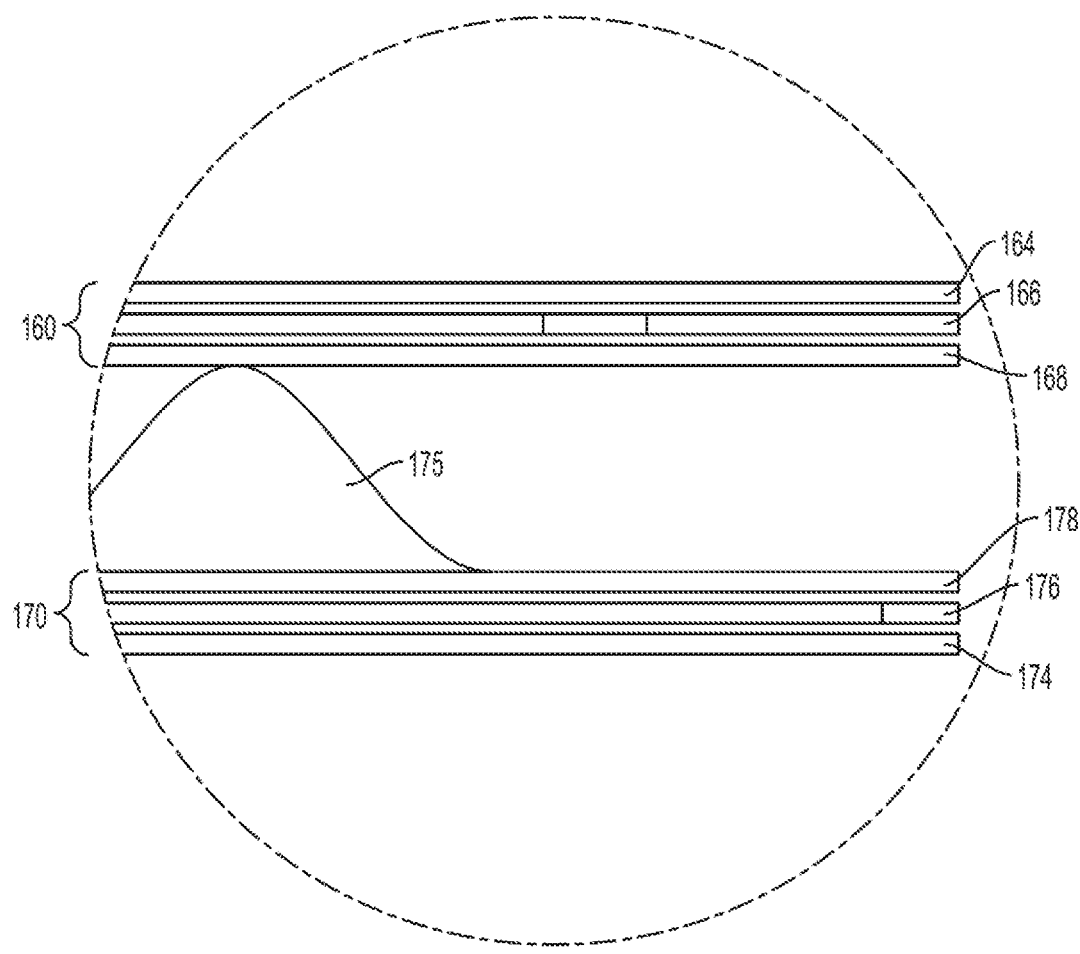
FIG. 7 is a detailed view of the region of the sensor pad circled in FIG. 6.

FIG. 7 shows a detailed view of an embodiment of the sensor pad 150. As shown in FIG. 7, each layer of the sensor pad or mat 150 may include three different materials. For example, the upper layer 160 may include a film layer 164. A primary conductor 166 such as, for example, Ag may be printed on the film layer. A secondary conductor 168, for example, Carbon based ink, may be printed on the primary conductor. The lower layer 170 may include a similar construction. For example, the lower layer may include a film layer 174. A lower primary conductor 176 such as, for example, Ag may be printed on the film layer 174. A lower secondary conductor 178, for example, Carbon based ink, may be printed on the primary conductor. The dielectric nodes 175 may be printed on the lower film layer 174.

For purposes of this disclosure, the term "coupled" means the joining of two components (electrical, mechanical, or magnetic) directly or indirectly to one another. Such joining may be stationary in nature or movable in nature. Such joining may be achieved with the two components (electrical or mechanical) and any additional intermediate members being integrally defined as a single unitary body with one another or with the two components or the two components and any additional member being attached to one another. Such joining may be permanent in nature or alternatively may be removable or releasable in nature.

The present disclosure has been described with reference to exemplary embodiments. However, persons skilled in the art will recognize that changes may be made in form and detail without departing from the spirit and scope of the disclosed subject matter. For example, although different exemplary embodiments may have been described as including one or more features providing one or more benefits, it is contemplated that the described features may be interchanged with one another or alternatively be combined with one another in the described exemplary embodiments or in other alternative embodiments. The technology of the present disclosure is relatively complex and thus not all changes in the technology are foreseeable. The present disclosure described with reference to the exemplary embodiments is manifestly intended to be as broad as possible. For example, unless specifically otherwise noted, the exemplary embodiments reciting a single particular element also encompass a plurality of such particular elements.

Exemplary embodiments may include program products comprising computer or machine-readable media for carrying or having machine-executable instructions or data structures stored thereon. For example, the occupant detection system may be computer driven. Exemplary embodiments illustrated in the methods of the figures may be controlled by program products comprising computer or machine-readable media for carrying or having machine-executable instructions or data structures stored thereon. Such computer or machine-readable media can be any available media which can be accessed by a general purpose or special purpose computer or other machine with a processor. Computer or machine-executable instructions comprise, for example, instructions and data which cause a general purpose computer, special purpose computer, or special purpose processing machines to perform a certain function or group of functions. Software implementations of the present invention could be accomplished with standard programming techniques with rule based logic and other logic to accomplish the various connection steps, processing steps, comparison steps and decision steps.

It is also important to note that the construction and arrangement of the elements of the system as shown in the exemplary embodiments is illustrative only. Although only a certain number of embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without material departing from the novel teachings and advantages of the subject matter recited. For example, elements shown as integrally formed may be constructed of multiple parts or elements shown as multiple parts may be integrally formed, the operation of the assemblies may be reversed or otherwise varied, the length or width of the structures and/or members or connectors or other elements of the system may be varied, the nature or number of adjustment or attachment positions provided between the elements may be varied. It should be noted that the elements and/or assemblies of the system may be constructed from any of a wide variety of materials that provide sufficient strength or durability. Accordingly, all such modifications are intended to be included within the scope of the present disclosure. The order or sequence of any process or method steps may be varied or re-sequenced according to alternative embodiments. Other substitutions, modifications, changes and omissions may be made in the design, operating conditions and arrangement of the exemplary embodiments without departing from the spirit of the present subject matter.

What is claimed is:

1. A sensing mat for use in a capacitive sensing system comprising:
   a first conductor;
   a second conductor;
   wherein the conductors are separated by a spacer;
   a sensing circuit operatively coupled to the first and second conductors and configured to sense the presence of an object using a measure of the capacitance between the first and second conductors;

and wherein the spacer includes a plurality of disconnected nodes of dielectric material, and wherein each of the nodes are separated from each of the other nodes to provide for space that allows the distance between at least a portion of the first and second conductors to decrease;

and wherein the nodes comprise ink and are printed onto a first base layer.

2. The sensing mat of claim 1, wherein each of the nodes is tapered upward from a wider base area in contact with the first base layer.

3. The sensing mat of claim 1, wherein the nodes are arranged in a pattern.

4. The sensing mat of claim 1, wherein the first conductor is located on the first base layer.

5. The sensing mat of claim 4, wherein the first conductor comprises ink that is printed on the first base layer.

6. The sensing mat of claim 5, wherein the first base layer comprises a plastic film.

7. The sensing mat of claim 6, wherein the nodes are tapered from a base to a top and the base of the node contacts the first base layer and the top of the node contacts a second base layer that includes the second conductor so that when force is applied to the second base layer the distance between the first conductor and the second conductor decreases.

8. The sensing mat of claim 6, wherein the first conductor and the nodes are printed on the same side of the first base layer.

9. A system for detecting an occupant in a vehicle comprising:
   an upper base layer including an upper electrode;
   a lower base layer including a lower electrode;
   a plurality of disconnected nodes located on the lower base layer, wherein the base layers are arranged so that when a downward force is applied to the upper base layer a distance between at least a portion of the upper electrode and the lower electrode decreases; and
   a controller including a sensing circuit operatively connected to the upper and lower electrodes and configured to detect the presence of the occupant using a measure of a capacitance between the upper and lower electrodes; and
   wherein each of the nodes comprise dielectric ink that is printed on the lower base layer.

10. The system of claim 9, wherein the plurality of nodes are arranged in a pattern.

11. The system of claim 9, wherein each of the nodes is tapered upward from the lower base layer.

12. A capacitive detection system comprising:
    an upper electrode printed on an upper film layer;
    a lower electrode printed on a lower film layer;
    a plurality of disconnected nodes of dielectric ink material printed in a spaced apart pattern on the lower film layer, wherein the upper film layer is positioned over the lower film layer so that when a downward force is applied to the upper film layer a distance between at least a portion of the upper electrode and the lower electrode decreases; and
    a controller operatively connected to the upper and lower electrodes and including a sensing circuit configured to detect the presence of a person applying the downward force using a measure of a capacitance between the upper and lower electrodes.

13. The system of claim 12, wherein the nodes are in contact with each of the upper and lower film layers.

14. The system of claim 13, wherein the nodes are arranged so that the nodes cover less than 20 percent of the surface area of the lower film layer.

15. The system of claim 14, wherein the nodes are arranged so that the pattern includes having a higher concentration of nodes on one portion of the lower film layer than on another portion of the lower film layer.

* * * * *